US010736250B1

(12) United States Patent
Kim et al.

(10) Patent No.: US 10,736,250 B1
(45) Date of Patent: Aug. 4, 2020

(54) TRANSPARENT FLEXIBLE SILVER NANOWIRE-BASED CONDUCTING FILM AND MANUFACTURING METHOD THEREOF

(71) Applicant: KOREA INSTITUTE OF SCIENCE AND TECHNOLOGY, Seoul (KR)

(72) Inventors: Sang Woo Kim, Seoul (KR); Jong Han Choi, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 16/679,289

(22) Filed: Nov. 11, 2019

(30) Foreign Application Priority Data

Mar. 20, 2019 (KR) ......................... 10-2019-0031868

(51) Int. Cl.
*H05K 9/00* (2006.01)
*B32B 15/02* (2006.01)
*B32B 37/04* (2006.01)

(52) U.S. Cl.
CPC .......... *H05K 9/0086* (2013.01); *B32B 15/02* (2013.01); *H05K 9/0088* (2013.01); *H05K 9/0094* (2013.01); *B32B 2307/212* (2013.01); *H05K 9/0081* (2013.01)

(58) Field of Classification Search
None
See application file for complete search history.

(56) References Cited

U.S. PATENT DOCUMENTS

| | | | |
|---|---|---|---|
| 10,024,840 B2 * | 7/2018 | Srinivas | A01N 59/16 |
| 2007/0074316 A1 * | 3/2007 | Alden | C30B 33/00 |
| | | | 257/784 |
| 2010/0243295 A1 * | 9/2010 | Allemand | H05K 9/0092 |
| | | | 174/250 |
| 2011/0281070 A1 * | 11/2011 | Mittal | H01L 31/1884 |
| | | | 428/142 |
| 2013/0000952 A1 * | 1/2013 | Srinivas | G06F 3/044 |
| | | | 174/126.1 |

(Continued)

FOREIGN PATENT DOCUMENTS

| | | | |
|---|---|---|---|
| EP | 3396719 A1 * | 10/2018 | ..... H01L 31/022466 |
| KR | 1020140040919 A | 4/2014 | |
| KR | 1020170106071 A | 9/2017 | |

OTHER PUBLICATIONS

Donggyu Kim, "Silver Nanowire Transparent Electromagnetic Shielding Interference Film reinforced by a strong networking for highly flexible devices," A Master's theses, Hanyang University, Dept. of Materials Science and Engineering, Feb. 2018, pp. 1-46, English abstract.

(Continued)

*Primary Examiner* — Joseph M. Pelham
(74) *Attorney, Agent, or Firm* — Cantor Colburn LLP

(57) ABSTRACT

A method of manufacturing a transparent flexible silver nanowire-based conducting film and a transparent flexible silver nanowire-based conducting film are provided. The method includes coating conductive nanowires, which shield and absorb electromagnetic interference, on a flexible substrate, sintering the conductive nanowires using a wet sintering process, and coating a polymer layer in which graphene flakes are dispersed on the flexible substrate with the conductive nanowires formed thereon.

16 Claims, 17 Drawing Sheets

(56) References Cited

U.S. PATENT DOCUMENTS

| | | | | |
|---|---|---|---|---|
| 2013/0251943 | A1* | 9/2013 | Pei | B29C 41/003 |
| | | | | 428/141 |
| 2014/0202738 | A1* | 7/2014 | Allemand | C09D 5/24 |
| | | | | 174/251 |
| 2014/0272199 | A1* | 9/2014 | Lin | H01L 51/444 |
| | | | | 427/600 |
| 2015/0359105 | A1* | 12/2015 | Yoon | H05K 3/061 |
| | | | | 174/268 |
| 2016/0346839 | A1* | 12/2016 | Ishii | C09B 67/0097 |
| 2017/0059117 | A1* | 3/2017 | Lee | B05D 3/007 |
| 2017/0353996 | A1* | 12/2017 | Lee | H05B 3/20 |
| 2018/0277787 | A1* | 9/2018 | Pei | H01L 51/0021 |
| 2018/0301648 | A1* | 10/2018 | Rantala | H01L 51/5206 |

OTHER PUBLICATIONS

Korean Office Action for Application No. 10-2019-0031868 dated Mar. 20, 2020, citing the above reference(s).In conformance with MPEP 609—Concise explanation of the relevance includes issue date of KR OA and references cited therein.

* cited by examiner

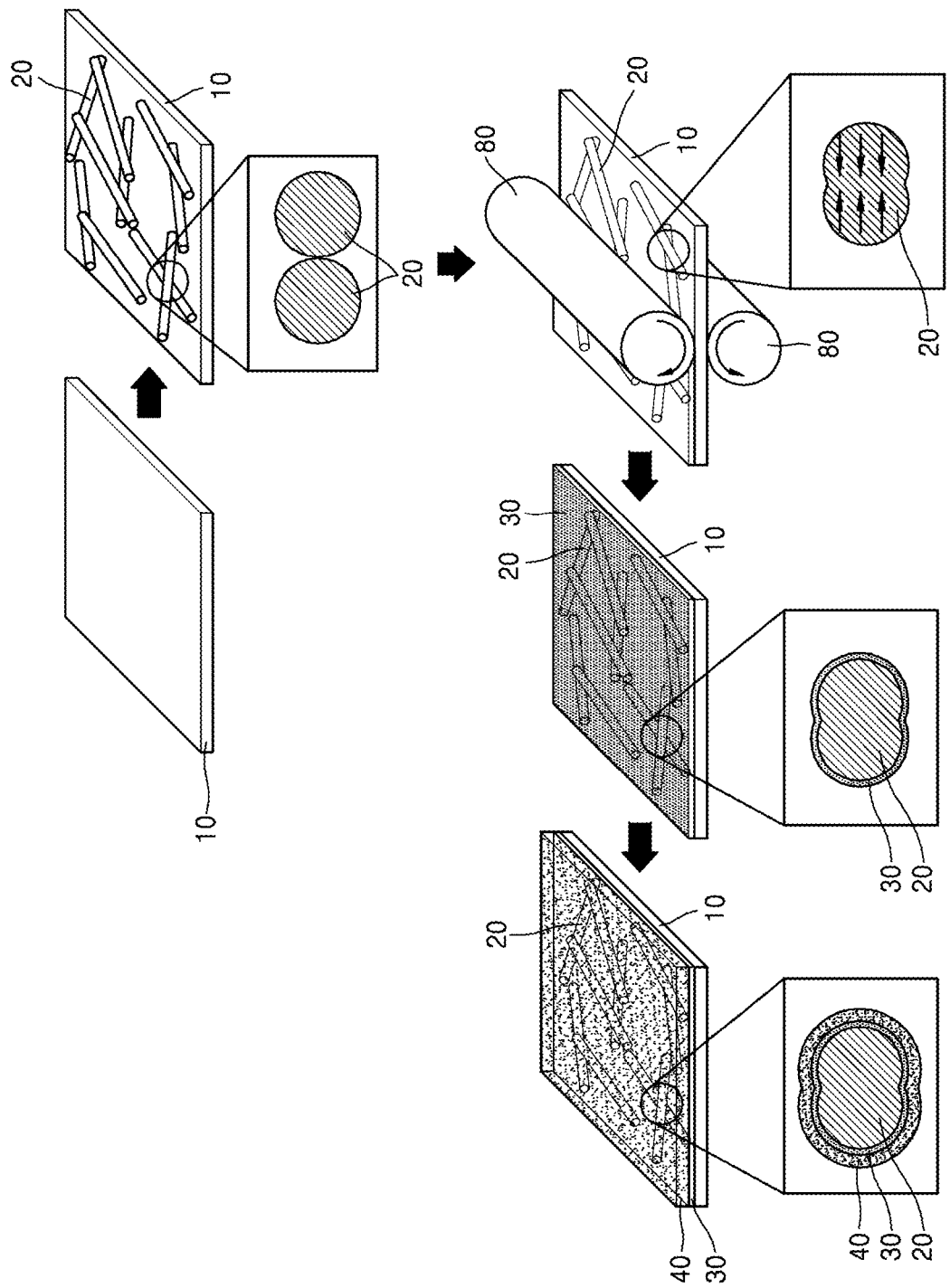

TRANSPARENT FLEXIBLE SILVER NANOWIRE-BASED CONDUCTING FILM AND MANUFACTURING METHOD THEREOF

CROSS-REFERENCE TO RELATED APPLICATION(S)

This application claims the benefit under 35 USC § 119(a) of Korean Patent Application No. 10-2019-0031868, filed on Mar. 20, 2019, in the Korean Intellectual Property Office, the entire disclosure of which is incorporated herein by reference for all purposes.

BACKGROUND

1. Field

The following description relates to a transparent flexible silver nanowire-based conducting film and manufacturing method thereof, and more specifically, to a transparent flexible silver nanowire-based conducting film for electrodes and/or electromagnetic interference shielding applicable to flexible devices and a manufacturing method thereof.

2. Description of Related Art

Recently, there is a growing demand for flexible devices in a variety of designs with portability and no restrictions in shape and form, such as wearable devices and foldable displays. However, as flexible devices become miniaturized and more flexible, interference occurs due to electromagnetic waves generated by each independent system, which may cause a problem in operating the device or a shortened lifespan.

In addition, research has shown that electromagnetic waves generated inside of a device may directly cause harmful influence on a human body. Therefore, in order to suppress the effects of electromagnetic wave interference generated by various flexible devices, the importance of electromagnetic interference shielding is increasing. Transparent conducting films used in flexible display devices are required to simultaneously have high electrical conductivity, high shielding property, light transmissivity, and high flexibility, but a shielding material that satisfies all of these properties has not yet been developed.

In order to improve electromagnetic interference shielding performance, it is preferable that the shielding material is thicker and has higher electric conductivity. However, in the case of flexible transparent shielding material, it is important to increase electric conductivity without reducing transmittance in order to enhance shielding performance because there is a limitation on the thickness of the shielding material due to required high light transmissivity.

Examples of transparent flexible electrode and/or transparent electromagnetic interference shielding film materials include transparent conducting oxide (TCO), metal mesh, and graphene. Recently, research on shielding films having a composite of metal mesh and graphene is being conducted. TCO transparent conducting film is mainly used in optoelectronic devices due to its high light transmissivity and electric conductivity. Indium tin oxide (ITO) is the most widely used TCO material due to its high transmittance and electric conductivity. However, by the nature of the oxide conductor, ITO easily cracks under a threshold radius of curvature condition (>7 mm), and hence it is not suitable as a flexible transparent electrode and/or electromagnetic interference shielding material. Al-doped ZnO, which is an alternative TCO for ITO, has relatively high flexibility but has shielding performance of 6.5 dB (0.3-1.5 GHz) at a transmittance of 84.2%. Thus, Al-doped ZnO has a limited shielding property and hence has a limitation as a flexible transparent electromagnetic interference shielding material.

Meanwhile, a metal-mesh type conducting material made using an etching technique is being studied to realize higher transmittance and shielding performance. Metal mesh exhibits a high electrical conductivity and a high electromagnetic interference shielding efficiency along with high transmittance, but the process thereof is completed and requires high cost and there is an issue of vulnerability to a repetitive fatigue characteristic. A metal mesh transparent shielding film that is fabricated using an inkjet technology in an attempt to address complexity of the conventional metal mesh process has a shielding value of 20 dB (8-12 GHz) at a transmittance of 88.2%.

Single-layer CVD graphene, which is being recently studied due to its high flexibility and excellent conductivity, has a low shielding performance of 2.27 dB (2.2-7 GHz) at a very high light transmittance, i.e., a transmittance of 97%. Multi-layer graphene produced to enhance the shielding performance shows a high shielding performance of 19.14 dB (18-26.5 GHz) at a transmittance of 80.5%, but the process thereof is very complicated and large-area production is difficult.

The next-generation materials that are promisingly studied to overcome the above drawbacks are flexible transparent conducting materials using nanowires. Silver nanowires (Ag NWs) are considered as the most promising candidate materials due to their excellent transparency, electric conductivity, and mechanical flexibility. In addition, Ag NWs are sprayed in the form of ink droplets and a roll-to-roll coating process can be performed on a flexible substrate at room temperature, thereby enabling mass-production at a low cost.

Despite these advantages, the Ag NWs have weakened networking properties due to an insulating capper used to anisotropically grow the nanowires during a polyol synthesis process. Due to this fact, bonding is not properly performed at junctions between the nanowires so that contact resistance is increased. Also, the Ag NWs has a weak bonding strength to a substrate and is vulnerable to moisture and oxygen because it is made of metal. In addition, the Ag NWs reflect light to cause scattering. These characteristics are problems that must be solved when the Ag NWs are applied to electronic devices.

Several methods have been recently suggested to solve a contact resistance problem of Ag NWs and to enhance networking between the nanowires. High temperature sintering, physical pressing, optical pressing, and wet heating have been proposed. In addition, research has been conducted on a composite of conductive polymers to suppress scattering properties of Ag NWs and to enhance bonding strength to a substrate. However, there are drawbacks of a lack of scalability to mass-production and large-area processes and requirement of long process time and high cost.

SUMMARY

In view of the foregoing problems, the present invention is to provide a transparent flexible silver nanowire-based conducting film for electrodes and/or electromagnetic interference shielding which is mass-producible and large-area producible and has excellent electrical conductivity, light transmittance and electromagnetic interference shielding performance and a manufacturing method thereof. However, the problems sought to be solved by the present invention are illustrative and the scope of the present invention is not limited thereto.

According to one general aspect, there is provided a method of manufacturing a transparent flexible silver nanowire-based film. The method may include: coating conductive nanowires, which shield and absorb electromagnetic interference, on a flexible substrate; sintering the conductive nanowires using a wet sintering process; and coating a polymer layer in which graphene flakes are dispersed on the flexible substrate with the conductive nanowires formed thereon.

The method may further include, between the sintering of the conductive nanowires and the coating of the polymer layer, planarizing the conductive nanowires.

The method may further include, after the coating of the polymer layer, coating a silane-treated hydrophobic solution on the flexible substrate.

The silane-treated hydrophobic solution may include at least one selected from a group consisting of methyltriethoxysilane (MTES), phenyl triethoxysilane (PhTES), octal triethoxysilane (OTES), tetraethylorthosilicate (TEOS), hexadecyltrimethoxysilane (HDTMS), and glycidoxypyltrimethoxysilane (GPTMS).

The flexible substrate coated with the silane-treated hydrophobic solution may be dried for 0.1 to 3 hours at a temperature range from 50° C. to 130° C.

The flexible substrate coated with the silane-treated hydrophobic solution may be dried for 0.5 to 1.5 hours at a temperature range from 105° C. to 115° C.

A temperature-adjustable laminating machine may be used for the wet sintering process and a temperature of a roll provided to the laminating machine may be controlled in a temperature range from 100° C. to 200° C.

After the coating of the polymer layer, the flexible substrate coated with the polymer layer in which the graphene flakes are dispersed may be dried for 1 to 12 hours at a temperature range from 20° C. to 100° C.

After the coating of the polymer layer, the flexible substrate coated with the polymer layer in which the graphene flakes are dispersed may be dried for 5.5 to 6.5 hours at a temperature range from 35° C. to 45° C.

The polymer layer may include polyurethane.

According to another aspect, there is provided a transparent flexible silver nanowire-based film. The transparent flexible silver nanowire-based film may include conductive nanowires formed by being sintered on at least a part of a flexible substrate and a polymer layer coated to surround surfaces of the conductive nanowires, wherein the polymer layer include graphene flakes.

The transparent flexible silver nanowire-based film may include a silane-treated hydrophobic coating layer coated to surround a surface of the polyurethane.

The silane-treated hydrophobic solution includes at least one selected from a group consisting of MTES, PhTES, OTES, TEOS, HDTMS, and GPTMS.

The flexible substrate may include at least one selected from a group consisting of PET (polyethyleneterephthalate), PC (polycarbonate), PMMA (polymethyl methacrylate), TAC (triacetylcellulose), PEN (polyethylene naphthalate), and PES (polyethersulfone).

The conductive nanowires may include at least one selected from a group consisting of metal, conductive ceramics, conductive polymers, and composites thereof.

The polymer layer may include polyurethane.

Other features and aspects will be apparent from the following detailed description, the drawings, and the claims.

BRIEF DESCRIPTION OF THE DRAWINGS

FIG. 2 is a conceptual view for describing a method of manufacturing a transparent flexible silver nanowire-based conducting film for electrodes and/or electromagnetic interference shielding film according to another embodiment of the present invention.

Figure 1:
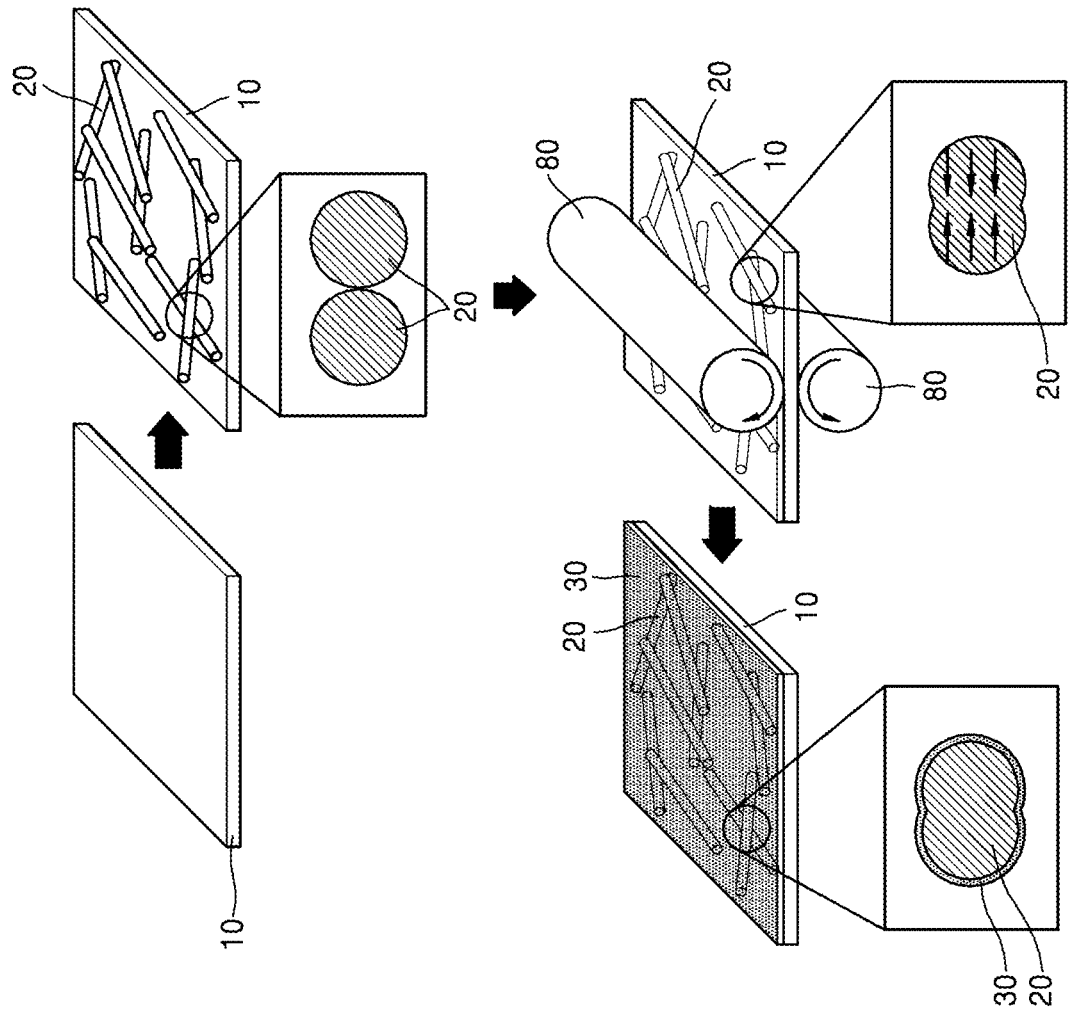
FIG. 1 is a conceptual view for describing a method of manufacturing a transparent flexible silver nanowire-based conducting film for electrodes and/or electromagnetic interference shielding film according to one embodiment of the preset invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the sizes of elements may be exaggerated or reduced for convenience of explanation.

In recent years, rapidly increasing demands for highly flexible devices have increased the need for a flexible transparent conducting film against the electromagnetic interference that can cause these devices to malfunction and that poses a hazard to human health. Furthermore, because highly flexible devices are prone to repetitive fatigue, due to repeated bending or stretching, and/or corrosion and contamination, highly flexible transparent conducting materials should be developed for flexible electrodes and/or EMI shielding in such devices.

Electromagnetic waves generated from a flexible and miniaturized flexible device may cause a problem in operating a device or harmful effect on a human body. The importance of electromagnetic interference shielding of a flexible device is increasing in order to suppress the electromagnetic waves. A shielding film having a composite of metal mesh and graphene has been researched, but the process thereof is complicated and it has an issue of vulnerability to fatigue.

To solve these problems, the present invention realizes a transparent flexible silver nanowire-based conducting film with excellent electrical conductivity, electromagnetic interference shielding performance, flexibility, and durability due to the formation of an overcoat layer and the enhancement of networking between nanowires caused by using a wet sintering method capable of a roll-to-roll process.

Hereinafter, a transparent flexible silver nanowire-based conducting film and manufacturing method thereof according to embodiments of the present invention will be described in detail with reference to the accompanying drawings.

FIG. 1 is a conceptual view for describing a method of manufacturing a transparent flexible silver nanowire-based conducting film according to one embodiment of the preset invention.

Referring to FIG. 1, the method may include coating conductive nanowires 20 on a flexible substrate 10, sintering the conductive nanowires 20 using a wet sintering process, and coating a polymer layer 30 in which graphene flakes are dispersed on the flexible substrate 10 with the conductive nanowires 20 formed thereon.

Specifically, the flexible substrate 10 may be, for example, a polyethyleneterephtalate (PET) substrate. Here, the thickness of the flexible substrate 10 may be in a range of from 25 µm to 150 µm. The range of the thickness of the flexible substrate 10 is adequately adjustable for high transmittance according to material and thickness of a shielding material.

When the thickness of the flexible substrate 10 is less than 25 µm, the flexible substrate 10 is excellent in terms of transmittance and flexibility, but durability is degraded. On the contrary, when the thickness of the flexible substrate 10 is greater than 150 µm, durability may be satisfied, but transmittance and flexibility are degraded. Thus, by considering these facts, the flexible substrate 10 needs to be designed to have a thickness in a range of from 25 µm to 150 µm.

The conductive nanowires 20 may be coated on at least a part of the flexible substrate 10. The conductive nanowires 20 each may have a diameter in a range of from 35 nm to 45 nm and a length in a range of from 5 µm to 15 µm.

The conductive nanowires 20 may be formed of a conductive material having a needle-like or thread-like shape and a diameter in nanometer size and may be linear or curved. A conductive film with excellent bending resistance may be achieved by use of a transparent conductive layer composed of conductive nanowires. Also, when a transparent conductive layer composed of the conductive nanowires 20 is used, the conductive nanowires 20 form a mesh structure, and hence it is possible to form a good electric conduction path even with the small amount of conductive nanowires 20. Additionally, it is possible to achieve a conductive film with small electric resistance. Moreover, since the conductive nanowires 20 forms the mesh structure and openings are formed in a mesh, it is possible to achieve a conductive film with high light transmittance. Specifically, when the conductive nanowires 20 having a large aspect ratio are used, the conductive nanowires 20 cross each other in a satisfactory manner, so that high conductivity can be achieved with the use of a small amount of conductive nanowires 20 and at the same time a conductive film with high light transmittance can be obtained.

The conductive nanowires 20 may include at least one selected from a group consisting of metal, conductive ceramics, conductive polymers, and composites thereof. Here, the metal may include at least one selected from a group consisting of silver, copper, aluminum, gold, palladium, platinum, nickel, rhodium, ruthenium, tungsten, zinc, silver-gold alloy, copper-nickel alloy, silver-palladium alloy, and silver-gold-palladium alloy.

In addition, the conductive ceramics may include at least one selected from a group consisting of indium tin oxide (ITO), doped zinc oxide, silicon carbide, carbon, carbon nanofibers, carbon nanotubes, and graphene, and the conductive polymer may include at least one selected from a group consisting of polyacetylene, polypyrrole, polythiophene, polyisothianaphthene, polyalkythiophene, and polyfuran.

After coating the conductive nanowires 20 on the flexible substrate 10, the conductive nanowires 20 may be sintered using a wet sintering process. For example, in the wet sintering process, a laminating machine may be used. The laminating machine is provided with a temperature-adjustable roll 80 capable of pressing the flexible substrate 10. A temperature of the roll provided in the laminating machine may be controlled in a range from 100° C. to 200° C. Here, a basic configuration of the laminating machine is already known, and thus a detailed description of the machine will be omitted.

The method of manufacturing a transparent flexible silver nanowire-based conducting film according to one embodiment of the present invention may include a planarization process. For example, the roughness of the surface of contact areas of the conductive nanowires may be reduced by repeating the wet sintering process two to three times.

The flexible substrate 10 with the conductive nanowires 20 formed thereon may be planarized, thereby improving transmittance.

Referring to FIG. 1, the polymer layer 30 in which graphene flakes are dispersed may be coated on the flexible substrate 10 with the conductive nanowires 20 formed thereon. It is desirable that the polymer of the polymer layer 30 is polyurethane. In the present specification, a description is given by assuming that the polymer is polyurethane, but the embodiment is not necessarily limited to polyurethane. Graphene oxide is easily dispersed in polymer, but graphene itself is hardly dispersed in polymer, and thus dispersibility may be enhanced using graphene flakes. Since the graphene flakes have high dispersibility, transmittance of a transparent flexible silver nanowire-based conducting film may be enhanced.

A solution obtained by dispersing graphene flakes in a polyurethane resin composition may be coated on the flexible substrate 10 using a spin coating method. The flexible substrate 10 on which polyurethane with the graphene flakes dispersed therein is coated may be dried for 1 to 12 hours at a temperature range from 20° C. to 100° C. Preferably, the flexible substrate 10 may be dried for 5.5 to 6.5 hours at a temperature range from 35° C. to 45° C. The above drying process may be understood as a process of removing a residual solution from the flexible substrate 10 and the temperature and time may be effectively controlled according to the amount of the residual solution.

The graphene flakes may be included in an amount of from 0.1 to 1 part by weight with respect to the polyurethane resin composition in an amount of 100 parts by weight. When the content of the graphene flakes is insufficient, electromagnetic interference shielding property and electric conductivity may be degraded, and when the content of the graphene flakes is excessive, transmittance and flexibility of the transparent flexible silver nanowire-based conducting film may be degraded.

FIG. 2 is a conceptual view for describing a method of manufacturing a transparent flexible silver nanowire-based conducting film according to another embodiment of the present invention. According to an additional embodiment, a silane-treated hydrophobic solution 40 may be coated on a flexible substrate 10 after a drying process of a solution containing polyurethane is completed. The silane-treated hydrophobic solution 40 may include at least one selected from a group consisting of methyltriethoxysilane (MTES), phenyl triethoxysilane (PhTES), octal triethoxysilane (OTES), tetraethylorthosilicate (TEOS), hexadecyltrimethoxysilane (HDTMS), and glycidoxy-pyltrimethoxysilane (GPTMS).

The silane-treated hydrophobic solution 40 may be coated on the flexible substrate 10 using a spin coating method. The flexible substrate 10 coated with the silane-treated hydrophobic solution 40 may be dried for 0.1 to 3 hours at a temperature range from 50° C. to 130° C. Preferably, the flexible substrate 10 may be dried for 0.5 to 1.5 hours at a temperature range from 105° C. to 115° C. The above drying process may be understood as a process of removing a residual solution from the flexible substrate 10 and the temperature and time may be effectively controlled according to the amount of the residual solution.

The transparent flexible silver nanowire-based conducting film 100 implemented by the above-described manufacturing method may include conductive nanowires 20 formed by being sintered on at least a part of the flexible substrate 10 and a polymer layer 30 coated to surround the surface of the conductive nanowires 20, and the polymer layer 30 may include graphene flakes. For example, the flexible substrate 10 may include PET.

The transparent flexible electromagnetic interference shielding film 100 implemented by the above-described manufacturing method may further include a silane-treated hydrophobic coating layer 40 coated to surround the surface of the polymer layer 30. The silane-treated hydrophobic coating layer 40 may be formed by spin-coating a silane-treated hydrophobic solution on the surface of the polymer layer 30.

The conductive nanowires 20 each may have a structure that is coated to be surrounded with the polymer layer including the graphene flakes and is not exposed to the outside. The polymer layer may also have a structure that is coated to be surrounded with the silane-treated hydrophobic coating layer 40 and is not exposed to the outside. Alternatively, the conductive nanowires 20 coated with the polymer layer including the graphene flakes are bonded to the flexible substrate 10, and the silane-treated hydrophobic coating layer 40 is formed over the entire surface of the flexible substrate 10 to protect the conductive nanowires 20 coated with the polymer layer and to enhance adhesion between the conductive nanowires 20 and the flexible substrate 10.

Hereinafter, experimental examples for understanding characteristics of a transparent flexible silver nanowire-based conducting film samples implemented by a method of manufacturing a transparent flexible silver nanowire-based conducting film of the present invention will be described. However, it should be noted that these examples are provided for illustration only and should not be construed in any way as limiting the embodiments of the invention.

In the present invention, a PET substrate in a thickness of 25 μm to 150 μm, Ag nanowires dispersed in isopropyl alcohol (TAP), and a 2-component polyurethane composition containing polyester polyol and methylene bis (4-cyclohexyl isocyanate) were used, and graphene flakes having a diameter of 5 μm and having a specific surface area of 50 m2/g and the Ag nanowires have a diameter of 20 nm to 25 nm and a length of 25 μm to 30 μm were used. To prepare a silane-treated hydrophobic solution, methyltriethoxysilane (MTES), phenyl triethoxysilane (PhTES), octal triethoxysilane (OTES), tetraethylorthosilicate (TEOS), hexadecyltrimethoxysilane (HDTMS), and glycidoxy-pyltrimethoxysilane (GPTMS) were dissolved in 50 mL of ethanol, the mixture was stirred for 14 hours at room temperature, and the stirred solution was redispersed using a homogenizer for 45 minutes, thereby producing a homogeneous hydrophobic suspension.

In the experimental example sample of the present invention, Ag nanowires were coated on the PET substrate using an auto film applicator. Thereafter, the PET substrate coated with the Ag nanowires was dried on a hot plate at a temperature of about 85° C. for about 10 minutes.

In order to sinter the Ag nanowires and planarize the surface of the Ag nanowires, a temperature-adjustable roll laminator was used, and at this time, the roll speed was fixed at 2.8 m/s. First, the surface coated with the Ag nanowires on the PET substrate was placed and pressed between rolls heated at about 130° C., thereby sintering the Ag nanowires. The PET substrate coated with the Ag nanowires was dried in a constant temperature drying-oven for 30 minutes at about 60° C.

Then, a polyurethane elastomer in which 0.2 wt % graphene flakes were dispersed was coated on the Ag nanowires using a spin coating method. The spin-coating speed was about 1000 rpm, the coating was performed for 20 seconds, and the PET substrate coated with polyurethane was dried in a constant temperature drying-oven at 40° C. for 6 hours so as to completely cure the polyurethane, thereby preparing the transparent flexible silver nanowire-based conducting film sample.

In another experimental example sample of the present invention, a silane-treated hydrophobic solution was coated on Ag nanowires on the transparent flexible silver nanowire-based conducting film sample using a spin coating method. The spin-coating speed was about 150 rpm, the coating was performed for 20 seconds, and the PET substrate coated with the silane-treated hydrophobic solution was dried in a constant temperature drying-oven at about 110° C. for 1 hour, thereby preparing the transparent flexible silver nanowire-based conducting film sample.

Hereinafter, in the drawing in accordance with the experimental examples of the present invention, Ag NW denotes a pristine Ag nanowire before sintering, SSN denotes a sintered Ag nanowire, G-UR denotes polyurethane in which graphene flakes are dispersed, and HS denotes a silane-treated hydrophobic coating layer. For example, it may be understood that G-UR/SSN denotes a sintered Ag nanowire coated with polyurethane in which graphene flakes are dispersed, and HS/G-UR/SSN denotes a silane-treated hydrophobic coating layer formed by coating the sintered Ag nanowires with the polyurethane in which graphene flakes are dispersed.

Figure 3A:
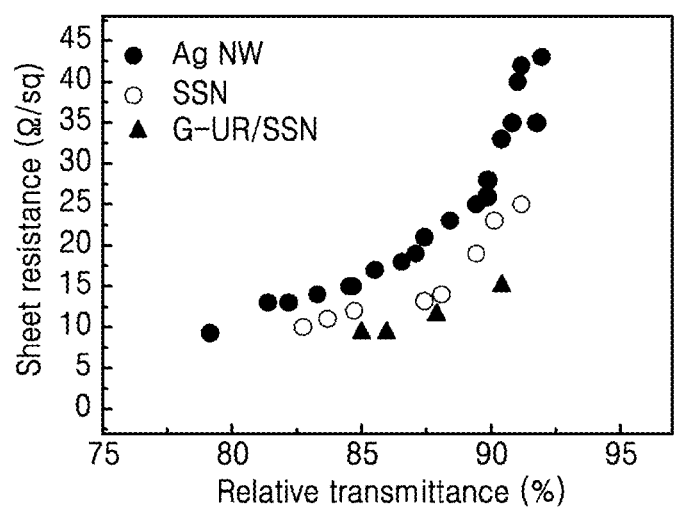
FIGS. 3A to 3C are graphs showing resistance changes and results of measuring shielding properties of transparent flexible silver nanowire-based conducting film samples according to an experimental example of the present invention.
Figure 3B:
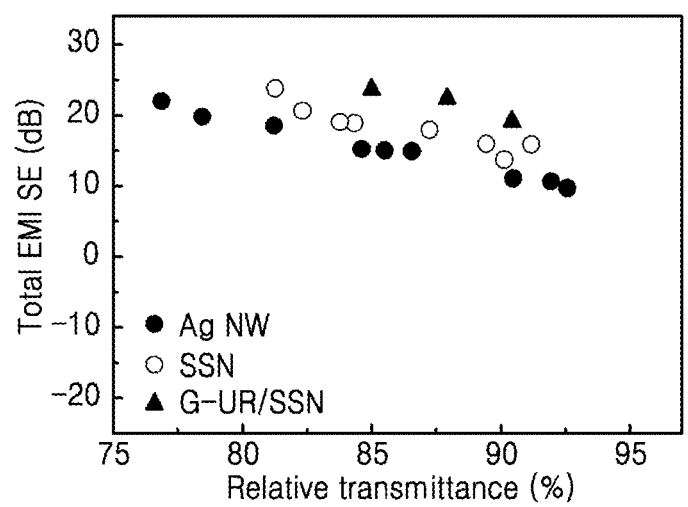
Figure 3C:
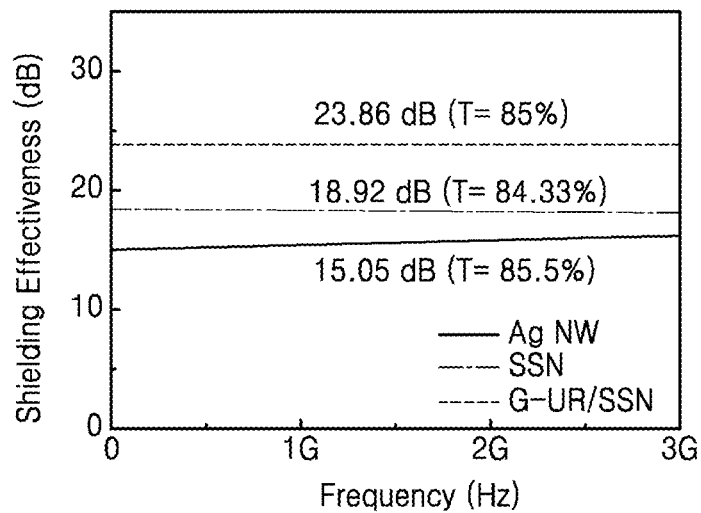

FIGS. 3A to 3C are graphs showing resistance changes and results of measuring shielding properties of transparent flexible silver nanowire-based conducting film samples according to an experimental example of the present invention.

FIG. 3A is a graph comparing sheet resistance values of Ag NW, SSN, and G-UR/SSN relative to transmittance. Rates of change in sheet resistance of pristine Ag nanowires and Ag nanowires fabricated with a wet sintering process and a polymer coating layer have a tendency to increase as the transmittance increases.

FIGS. 3B and 3C show shielding properties in accordance with the transmittance of the transparent flexible silver nanowire-based conducting film according to the experimental example of the present invention. Electromagnetic interference shielding effectiveness (EMI SE) has to take into account transmittance and permittivity. Therefore, a total EMI SE of Ag nanowires may be enhanced by reducing ohmic resistance between the nanowires. The sheet resistance of a G-UR/SSN film was reduced to 8 to 17 Ω/sq compared to the sheet resistance of Ag NWs and electric conductivity thereof was greatly increased 3.1 times, from $3.5 \times 10^5$ to $11 \times 10^5$ S/m, due to sintering effect. As a result, FIG. 3C shows that SE values of Ag NWs and G-UR/SSN before and after a wet sintering process were increased from 15.05 to 23.86 dB (at 1 GHz) at the same light transmittance of 85.5%.

Figure 4A:
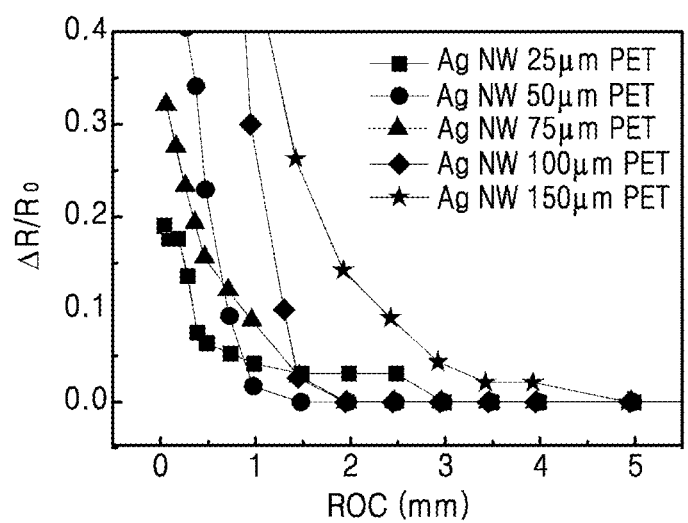
FIGS. 4A to 4C are graphs showing results of resistance change with respect to variations of radius of curvature (ROC) of a transparent flexible silver nanowire-based conducting film according to an experimental example of the present invention.
Figure 4B:
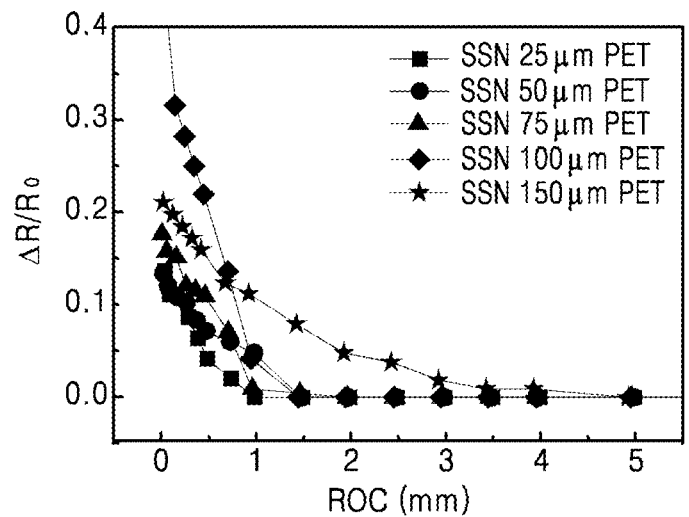
Figure 4C:
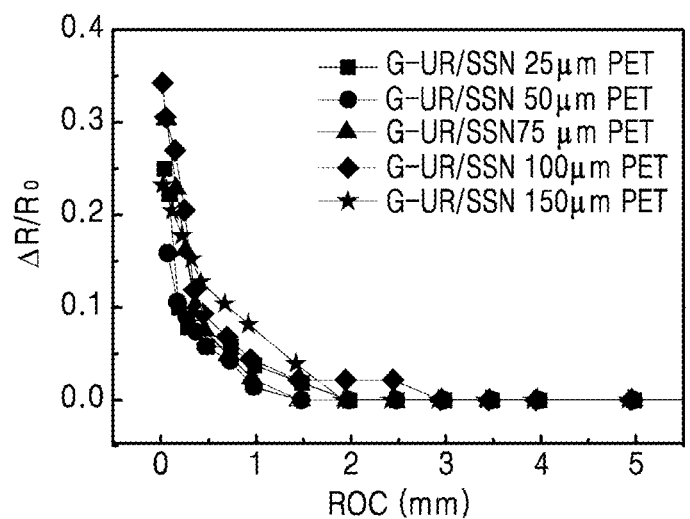

FIGS. 4A to 4C show results of resistance change with respect to variations of radius of curvature (ROC) according to the thickness of PET of the transparent flexible silver nanowire-based conducting film according to the experimental example of the present invention.

Referring to FIGS. 4A to 4C, it is shown that in the case of Ag NW, SSN, and G-UR/SSN EMI films each having a transmittance of 85%, a value of $\Delta R/R_0$ increases with a decrease of ROC and a threshold ROC decreases with a decrease of the thickness of a PET substrate.

Figure 5:
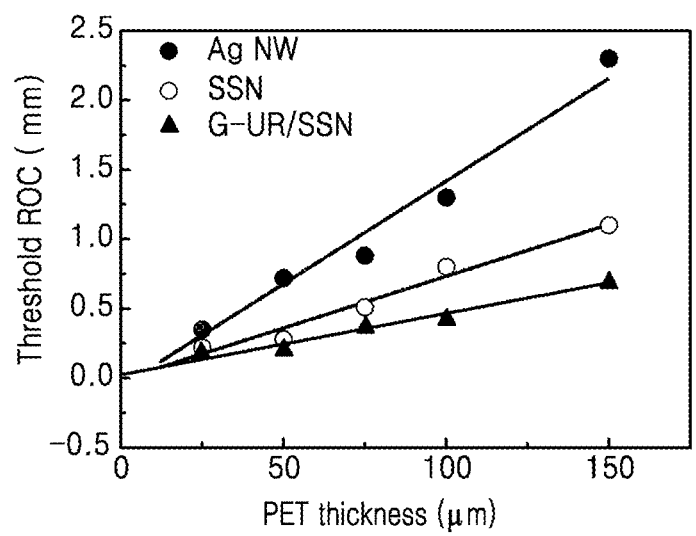
FIG. 5 is a graph showing a threshold ROC value in accordance with a PET thickness of the transparent flexible silver nanowire-based conducting film according to the experimental example of the present invention.

FIG. 5 shows variations of a threshold ROC value according to the PET thickness of Ag NW, SSN, and G-UR/SSN EMI films having a transmittance of 85%. The threshold ROC of the Ag NW film at a PET thickness of 25 μm was reduced about 3.7 times from 1.3 to 0.35 mm compared to a thickness of 100 μm. The threshold ROC of the G-UR/SSN film at a PET thickness of 25 μm was reduced from 0.43 to 0.19 mm compared to the threshold ROC at a PET thickness of 100 μm. The threshold ROC of The G-UR/SSN film is lower than the threshold ROC of the Ag NW film. Therefore, it is shown that the mechanical flexibility of the transparent flexible silver nanowire-based conducting film increases as the thickness of the PET substrate is reduced and NW networking is improved by the wet sintering process and the polymer coating layer.

Figure 6A:
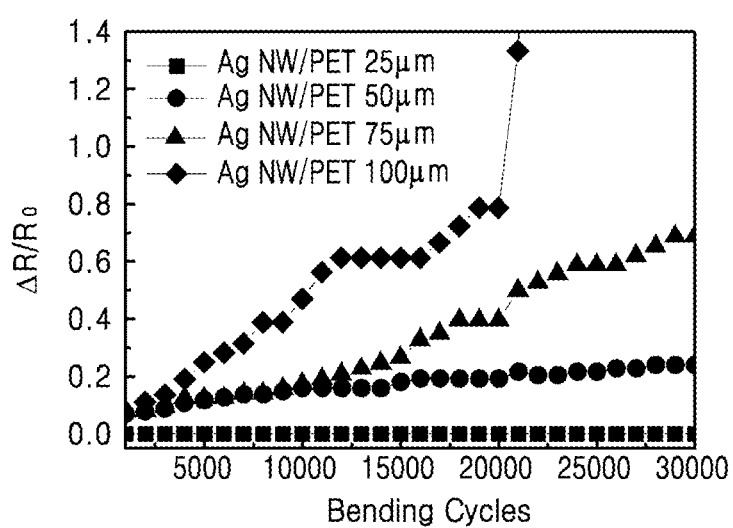
FIGS. 6A to 6C are graphs showing results of measuring resistance change of the transparent flexible silver nanowire-based conducting film according to the experimental example of the present invention.
Figure 6B:
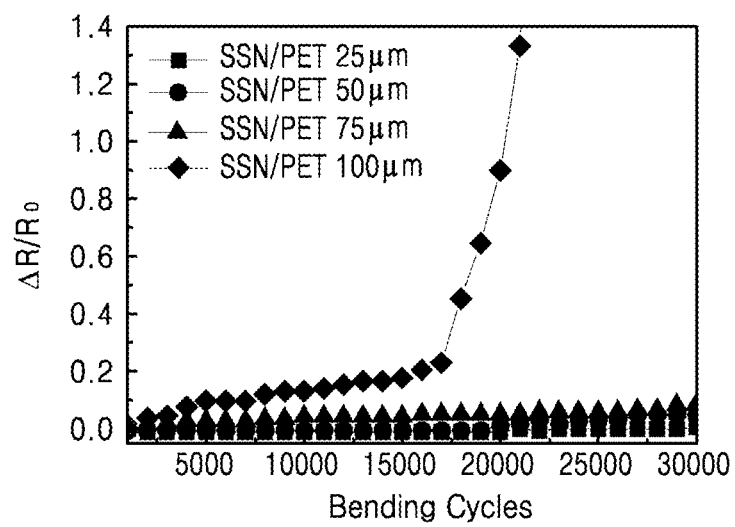
Figure 6C:
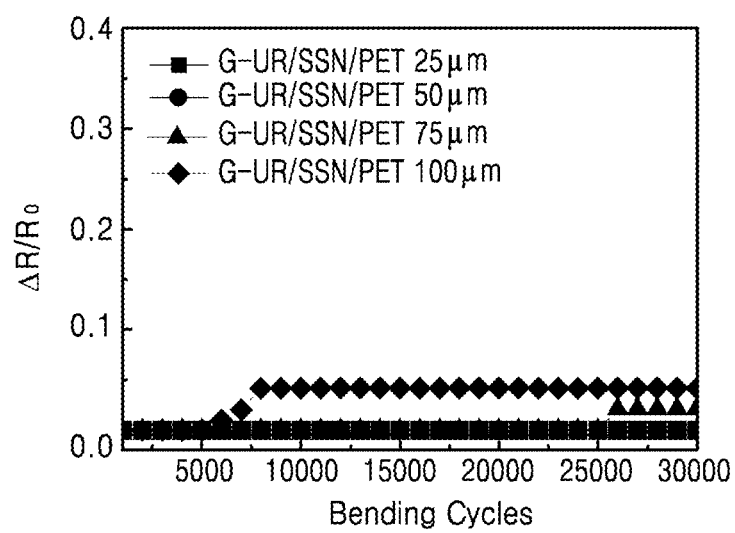

FIGS. 6A to 6C show $\Delta R/R_0$ of Ag NW, SSN, and G-UR SSN EMI films according to the thickness of a PET substrate after 30,000 bending tests at an ROC of 2 mm. As shown in FIG. 6A, $\Delta R/R_0$ of the Ag NW film at a PET thickness of 100 μm was increased by 66% after 17,000 cyclic bending tests whereas those of the Ag NW films at 75 μm and 50 μm were increased by 69% and 24% after 30,000 cyclic bending tests. It is shown that the Ag NW film at 25 μm had no change in resistance after 30,000 cyclic bending tests. As shown in FIG. 6B, $\Delta R/R_0$ of the SSN film at a PET thickness of 100 μm was increased 23% after 17,000 cyclic bending tests whereas those of the SSN films at 75 μm and 50 μm were increased by 8% and 5% after 30,000 cyclic bending tests. It is shown that the SSN film at 25 μm had no change in resistance even after 30,000 cyclic bending tests. FIG. 6C shows that the G-UR/SSN films at 25 μm and 50 μm had no change in resistance after 30,000 cyclic bending tests. As a result, the bending properties and flexibility of the silver nanowire-based conducting film are improved as the thickness of the PET substrate is reduced and the NW networking is enhanced.

Figure 7A:
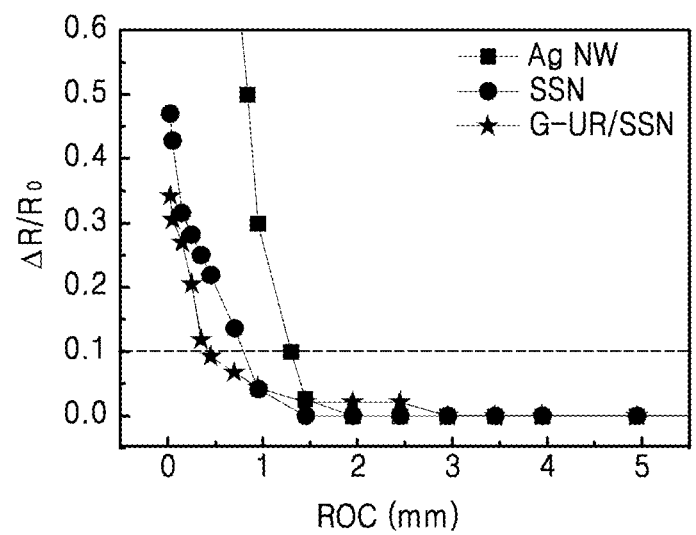
FIGS. 7A and 7B are graphs showing results of resistance change with respect to transmittance and variations of ROC of the transparent flexible silver nanowire-based conducting film samples according to the experimental example of the present invention.
Figure 7B:
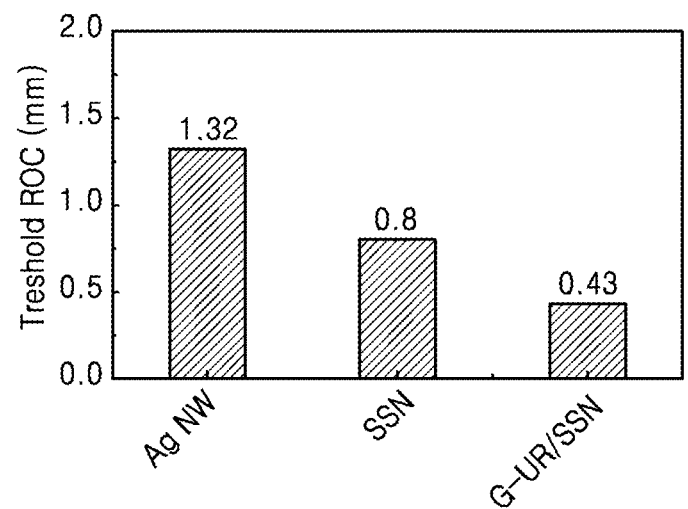

FIGS. 7A and 7B show results of resistance change with respect to variations of ROC of the transparent flexible silver nanowire-based conducting film samples according to the experimental example of the present invention. FIG. 7A shows $\Delta R/R_0$ of an EMI film on 100 μm PET. As shown in FIG. 7B, the SSN film has higher flexibility at the same light transmittance compared to the Ag NW film, and a threshold ROC was reduced from 1.32 to 0.8 mm. In the case of the G-RU/SSN film with improved adhesion to a substrate, a threshold ROC was greatly reduced from 1.32 to 0.8 mm. Consequently, the reduction of threshold ROC is due to an increased adhesion between the PET substrate and Ag NWs by an overcoat layer.

Figure 8A:
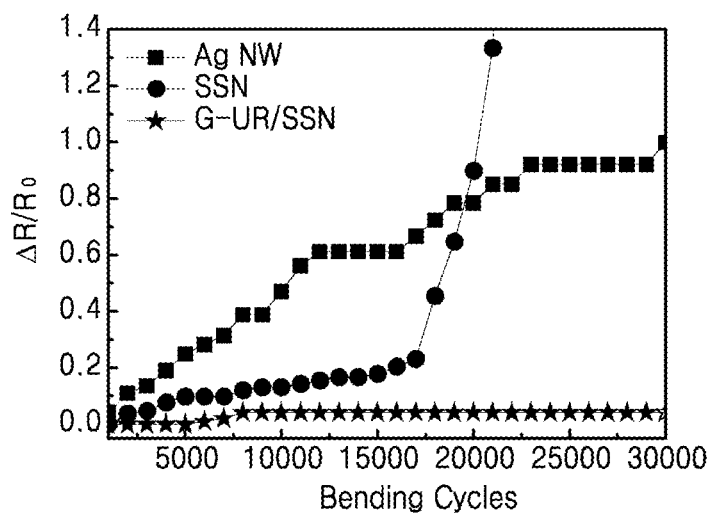
FIGS. 8A to 8D are graphs showing resistance change and changes in shielding performance after cyclic bending tests on the transparent flexible silver nanowire-based conducting film samples according to the experimental example of the present invention.
Figure 8B:
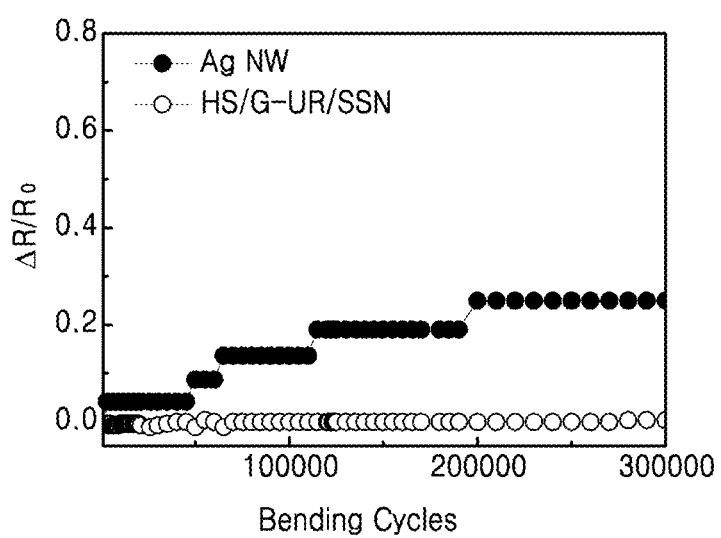
Figure 8C:
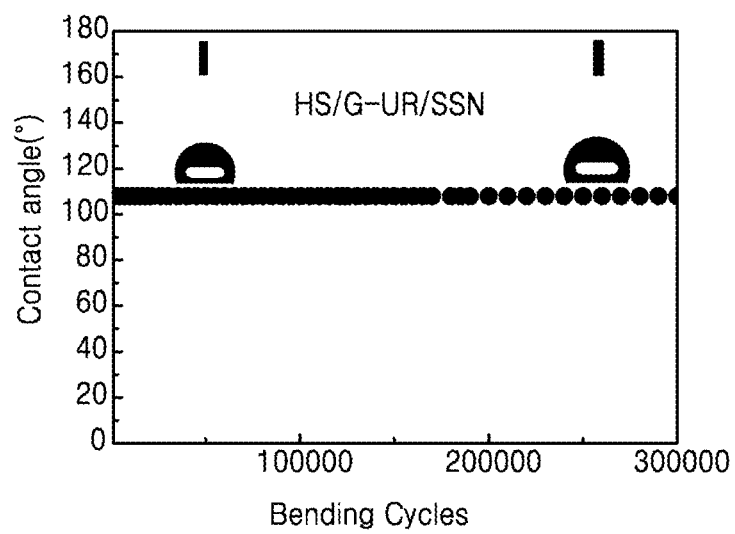
Figure 8D:
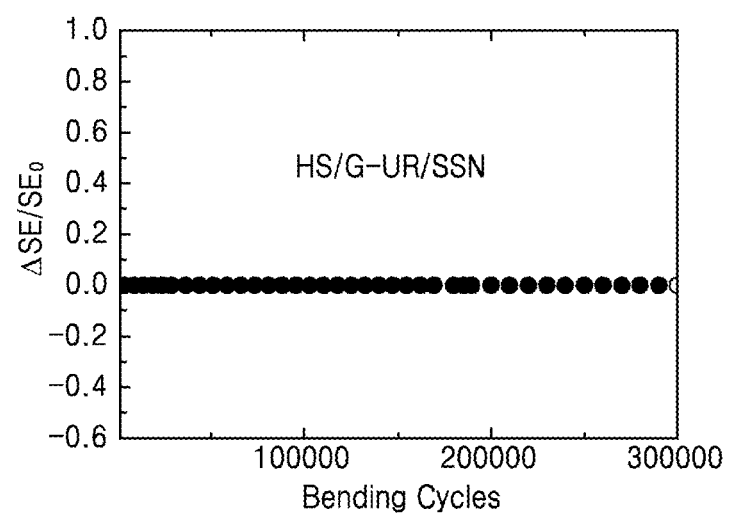

FIG. 8A shows $\Delta R/R_0$ of an Ag NW EMI shielding film on 100 μm PET (T: 85% at T: 550 nm) after 30,000 cyclic bending tests at an ROC of 2 mm. $\Delta R/R_0$ of the Ag NW film was increased by 66% after 17,000 cyclic bending tests whereas the SSN film was increased 23%. The bending flexibility of the SSN film was improved with enhanced NW networking. $\Delta R/R_0$ of the G-UR/SSN film was increased by 4.2% after 30,000 cyclic bending tests. Thus, it was confirmed that the flexibility and bending properties of the G-UR/SSN film were improved with an enhanced adhesion to a substrate due to a polyurethane elastomer overcoat layer containing 0.2 wt % graphene flakes. FIG. 8B shows that $\Delta R/R_0$ of an HS/G-UR/SSN EMI shielding film was not changed on 25 μm PET (T: 85% at T: 550 nm) after 300,000 cyclic bending tests at an ROC of 2 mm. FIG. 8C shows that HS/G-UR/SSN film maintained a constant contact angle. FIG. 8D shows that the HS/G-UR/SSN film maintained a constant total SE change value $\Delta SE/SE_0$ on 25 μm PET (T: 85% at T: 550 nm) after 300,000 cyclic bending tests at an ROC of 2 mm. Such results are due to a thin substrate and enhanced NW networking.

Figure 9A:
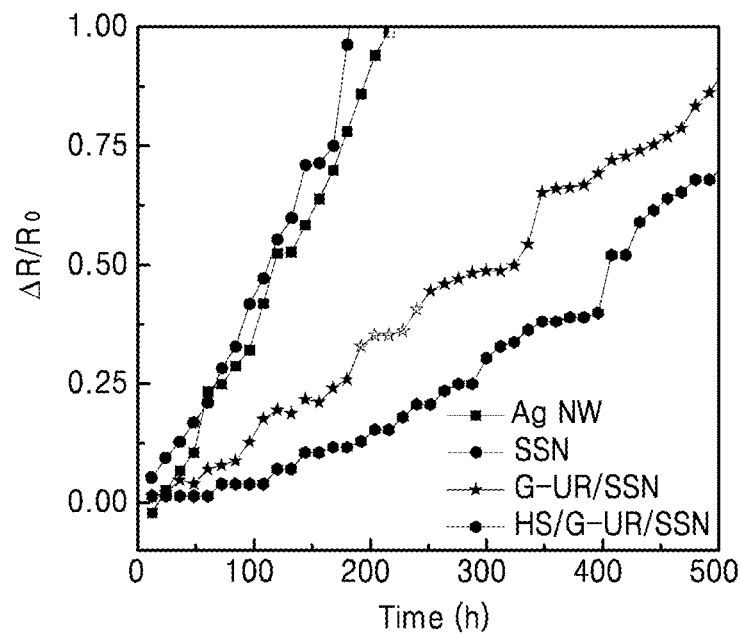
FIGS. 9A and 9B are graphs showing resistance change and changes in shielding performance, under constant temperature and humidity conditions, of the transparent flexible silver nanowire-based conducting film samples according to the experimental example of the present invention.
Figure 9B:
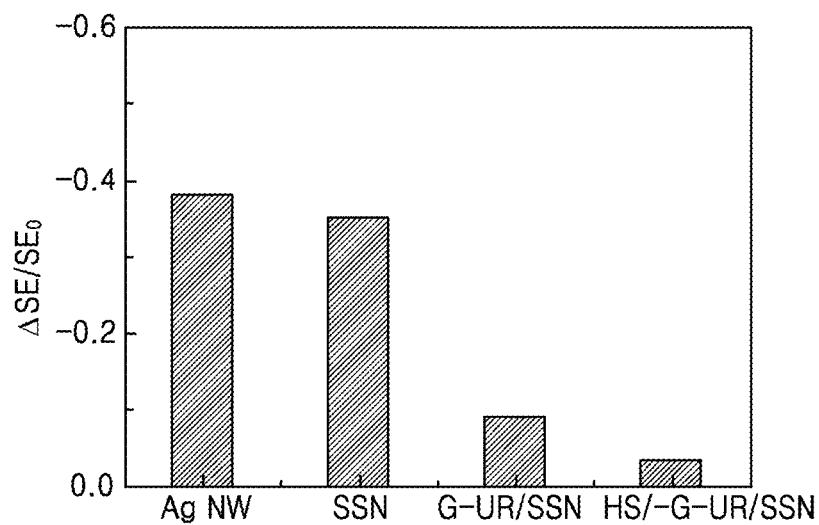

FIG. 9A shows $\Delta R/R_0$ of each Ag NW film with respect to temperature-humidity test time at the same humidity and temperature conditions (85° C. 85% relative humidity (RH)). $\Delta R/R_0$ of the Ag NW film was increased by 938% for 252 hours while that of the SSN film was increased by 156%. This result is due to the fact that hydrophilic PVP was partially removed during wet sintering and a contact angle was increased. $\Delta R/R_0$ of the G-UR/SSN film was increased by 91% after 500 hours. This result is due to the fact that a barrier layer of graphene flakes dispersed in polyurethane prevented oxygen transmission into the Ag NW coating layer. $\Delta R/R_0$ of the G-UR/SSN film was increased infinitely after 492 hours, whereas HS/G-UR/SSN film hardly changed even after 500 hours. This result indicates that the G-UR/SSN film coated with a silane-treated hydrophobic solution effectively prevents oxidation of Ag NWs for 500 hours when compared to before coating. FIG. 9B shows $\Delta SE/SE_0$ of the Ag NW EMI shielding film after a 500-hour temperature-humidity test (85° C./85% RH). $\Delta SE/SE_0$ of each of the Ag NW film and the SSG film was reduced by 38% and 35% after the 500-hour temperature-humidity test, whereas those of the G-UR/SSN film and the HS-G-UR/SSN film hardly changed.

Figure 10A:
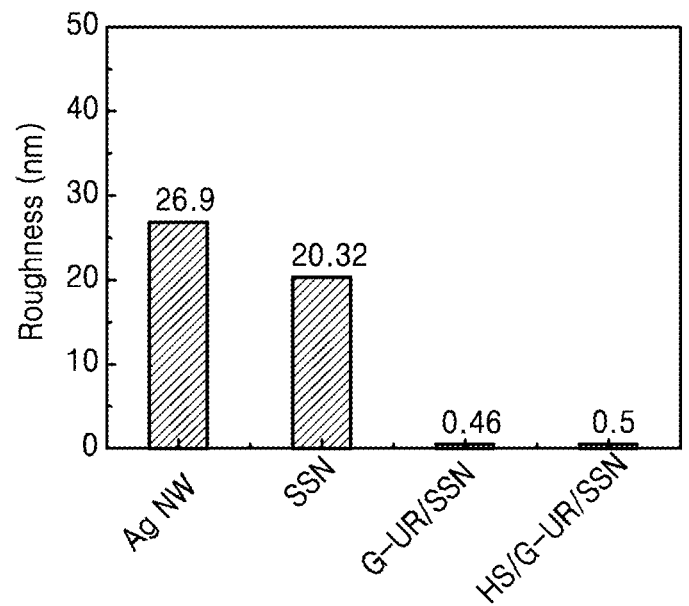
FIGS. 10A and 10B show results of surface roughness values and contact angles of the transparent flexible silver nanowire-based conducting film samples according to the experimental example of the present invention.
Figure 10B:
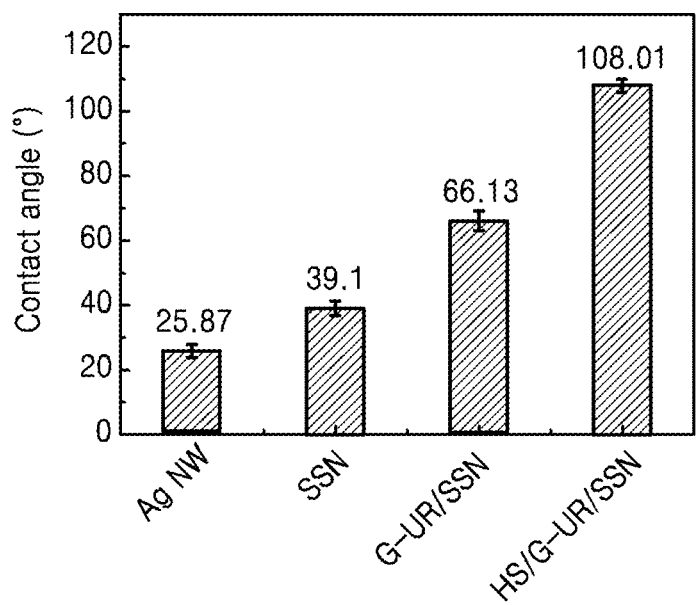
Figure 11A:
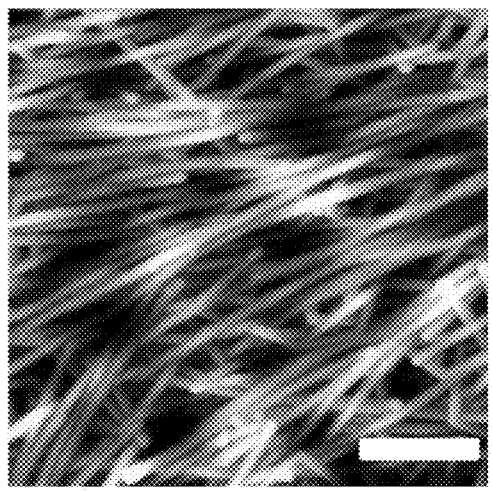
FIGS. 11A to 11D show photographs obtained from atomic force microscope (AFM) analysis of the transparent flexible silver nanowire-based conducting film samples according to the experimental example of the present invention.
Figure 11B:
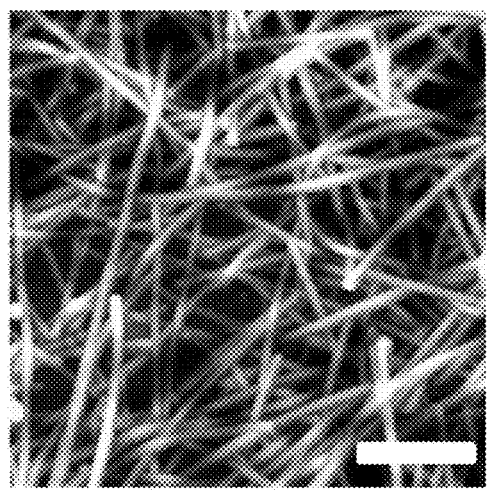
Figure 11C:
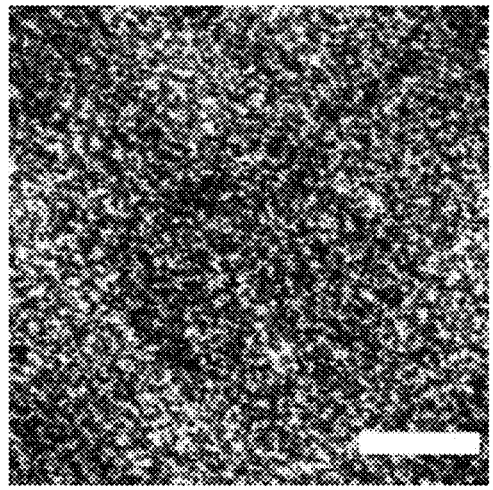
Figure 11D:
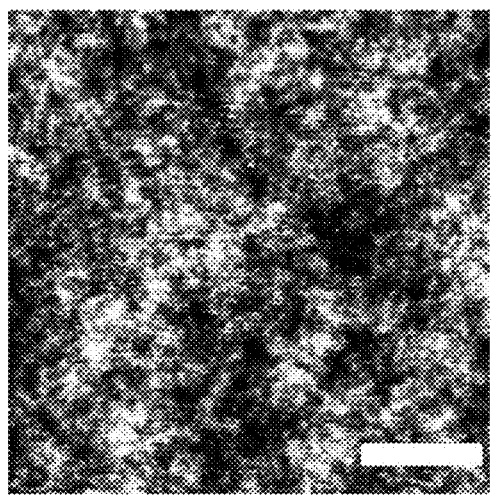

FIG. 10A shows a surface roughness value of the transparent flexible silver nanowire-based conducting film samples according to the experimental example of the present invention. The surface roughness value is used as a basis for evaluating an electrical network between NWs. When comparing surface roughness between Ag NW and SSN, it was confirmed that a Ra roughness value was reduced from 26.9 to 20.32 nm due to sintering of NW. A Ra roughness value was dramatically reduced to 0.46 nm by spin-coating G-UR on the SSN film. Graphene dispersed in a UR coating layer prevents Ag NWs from being oxidized by moisture and oxygen of an external environment due to the barrier effect of graphene particles. FIG. 10B shows a contact angle of the transparent flexible electromagnetic interference shielding film samples according to the experimental example of the present invention. The contact angles of Ag NW, SSN, G-UR/SSN, and HS/G-UR/SSN films were 25.87°, 39.1°, 66.13°, and 108.01°. The Ag NW film has hydrophilic PVP coating and a low contact angle since moisture can easily permeate into empty space between silver nanowires. In the SSN film, the contact angle was increased by 13.23° since hydrophilic PVP was partially removed during a wet sintering process. The HS/G-UR/SSN film showed the highest contact angle of 108.01° among the EMI films, and this was due to the silane-treated hydrophobic coating layer of the G-UR/SSN film. The silane-treated hydrophobic coating layer prevents silver nanowires from being oxidized by moisture and oxygen of an external environment.

FIGS. 11A to 11D respectively show the photographs of an Ag NW sample, an SSN sample, a G-UR/SSN sample, and an HS/G-UR/SSN sample which are obtained from atomic force microscope (AFM) analysis. In the case of the transparent flexible silver nanowire-based conducting film samples, it can be confirmed that surface roughness was improved due to wet sintering and an overcoat layer.

FIG. 12 and FIGS. 13A to 13D show results of measuring adhesion of the transparent flexible silver nanowire-based conducting film samples according to the experimental example of the present invention.

Figure 12:
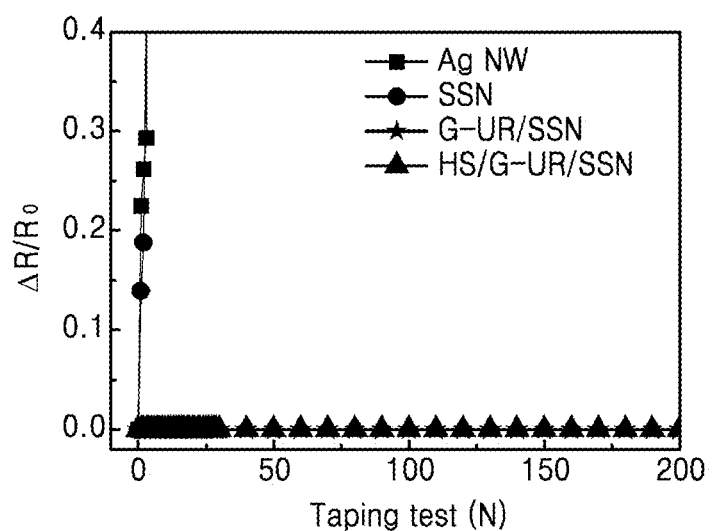
FIG. 12 shows results of measuring adhesion of the transparent flexible silver nanowire-based conducting film samples according to the experimental example of the present invention.

FIG. 12 is a graph comparing rates of change in resistance are compared according to the number of times of repeated attaching and peeling off of a general sticky tape by performing taping tests on the Ag NW, SSN, G-UR/SSN, and HS/G-UR/SSN samples so as to compare adhesion between a substrate of each transparent flexible silver nanowire-based conducting film sample and a coating layer. $\Delta R/R_0$ of the Ag NW film was increased by about 22% in one test but increased infinitely after 4 tests. $\Delta R/R_0$ of the SSN film was increased by 13% in one test. However, after 7 tests, $\Delta R/R_0$ was increased infinitely. This result indicates that an adhesion of the SSN film to a substrate is superior to the Ag NW film due to enhanced network characteristics by NW sintering. Meanwhile, $\Delta R/R_0$ of the G-UR/SSN and HS/G-UR/SSN films had no change even after 200 tests. This results from the improvement of adhesion to the substrate due to an overcoat layer.

Figure 13A:
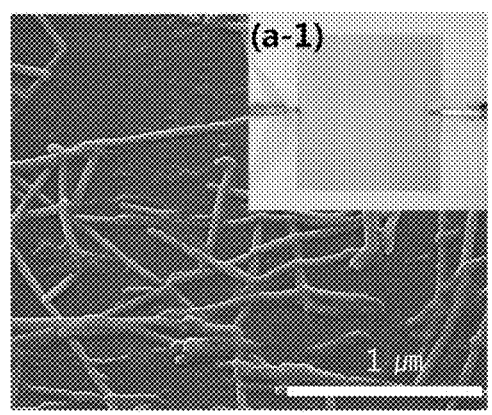
FIGS. 13A to 13D show photographs obtained from scanning electron microscope (SEM) analysis of results of measuring adhesion of the transparent flexible silver nanowire-based conducting film samples according to the experimental example of the present invention.
Figure 13B:
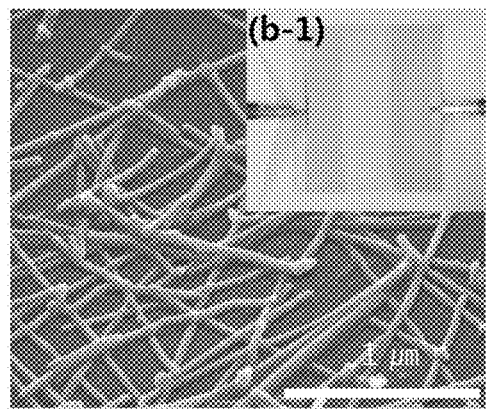
Figure 13C:
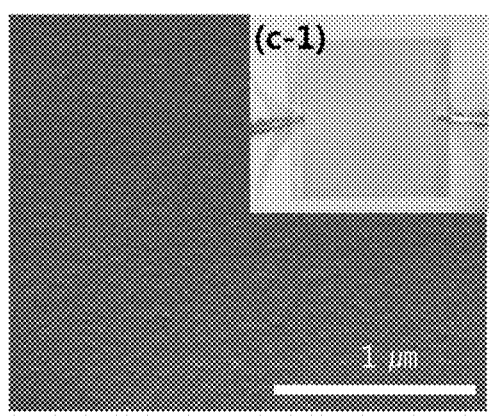
Figure 13D:
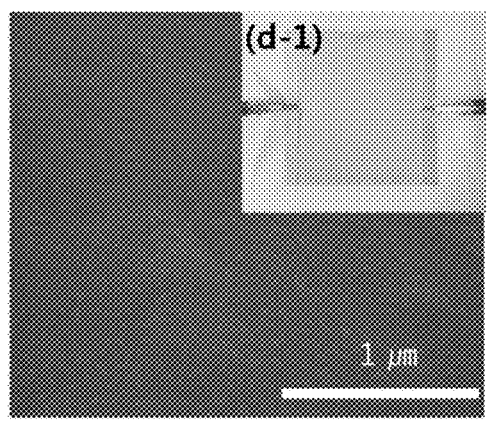

FIGS. 13A to 13D respectively show the photographs of the Ag NW sample, the SSN sample, the G-UR/SSN sample, and the HS/G-UR/SSN sample observed with a scanning electron microscope (SEM) after 200 taping tests on each sample. Referring to FIGS. 13A and 13B, it can be seen that an adhesion of a silver nanowire coating layer to a substrate is weak and the coating layer is peeled off. In FIGS. 13C and 13D, it can be seen that an adhesion to the substrate is improved by an overcoat layer and a coating layer is not peeled off.

As described above, the transparent flexible silver nanowire-based conducting film according to the embodiments of the present invention has high flexibility and durability due to an enhanced nanowire network structure and a silane-treated hydrophobic coating layer. Electric conductivity of the transparent flexible electromagnetic interference shielding film produced by a wet sintering process was greatly improved as compared to Ag NW and an SE value thereof at a transmittance of 85.5% is significantly increased from 15.05 to 23.86 dB. The transparent flexible silver nanowire-based conducting film produced by a wet sintering process is mass-producible by a roll-to-roll process and has high durability and flexibility. In addition, the transparent flexible silver nanowire-based conducting film has an excellent shielding value compared to transmittance, which provides high applicability to various high flexible devices, such as a flexible display, a flexible touch screen panel, a wearable device, and the like.

The transparent flexible silver nanowire-based conducting film showed a high flexibility property, in which adhesion between a substrate and nanowires was improved due to a G-UR coating layer containing dispersed graphene so that a threshold ROC was greatly reduced from 1.32 to 0.43 mm.

$\Delta R/R_0$ and a contact angle of the HS/G-UR/SSN film on 25 μm PET did not change after 300,000 cyclic bending tests at an ROC of 2 mm. $\Delta R/R_0$ of the HS/G-UR/SSN film hardly changed after 300,000 cyclic bending tests at an ROC of 2 mm and also hardly changed, due to the HS/G-UR coating layer, even after a 500-hour temperature-humidity test under conditions of 85° C./85% RH. Due to a water repellent effect of the silane-treated hydrophobic coating layer, electrode and/or electromagnetic interference shielding properties of the transparent flexible silver nanowire-based conducting film remained almost unchanged.

According to the embodiment of the present invention as described above, it is possible to realize a transparent flexible silver nanowire-based conducting film which has excellent electromagnetic interference shielding performance, flexibility and durability and is mass-producible and a manufacturing thereof. It will be appreciated that the scope of the present invention is not defined by the effect.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of manufacturing a transparent flexible silver nanowire-based film, the method comprising:
coating conductive nanowires, which shield and absorb electromagnetic interference, on a flexible substrate;
sintering the conductive nanowires using a wet sintering process; and
coating a polymer layer in which graphene flakes are dispersed on the flexible substrate with the conductive nanowires formed thereon.

2. The method of claim 1, further comprising, between the sintering of the conductive nanowires and the coating of the polymer layer, planarizing the conductive nanowires.

3. The method of claim 1, further comprising, after the coating of the polymer layer, coating a silane-treated hydrophobic solution on the flexible substrate.

4. The method of claim 3, wherein the silane-treated hydrophobic solution includes at least one selected from the group consisting of methyltriethoxysilane (MTES), phenyl triethoxysilane (PhTES), octal triethoxysilane (OTES), tetraethylorthosilicate (TEOS), hexadecyltrimethoxysilane (HDTMS), and glycidoxy-pyltrimethoxysilane (GPTMS).

5. The method of claim 3, wherein the flexible substrate coated with the silane-treated hydrophobic solution is dried for 0.1 to 3 hours at a temperature range from 50° C. to 130° C.

6. The method of claim 5, wherein the flexible substrate coated with the silane-treated hydrophobic solution is dried for 0.5 to 1.5 hours at a temperature range from 105° C. to 115° C.

7. The method of claim 1, wherein a temperature-adjustable laminating machine is used for the wet sintering process and a temperature of a roll provided to the laminating machine is controlled in a temperature range from 100° C. to 200° C.

8. The method of claim 1, wherein, after the coating of the polymer layer, the flexible substrate coated with the polymer layer in which the graphene flakes are dispersed is dried for 1 to 12 hours at a temperature range from 20° C. to 100° C.

9. The method of claim 8, wherein, after the coating of the polymer layer, the flexible substrate coated with the polymer layer in which the graphene flakes are dispersed is dried for 5.5 to 6.5 hours at a temperature range from 35° C. to 45° C.

10. The method of claim 1, wherein the polymer layer includes polyurethane.

11. A transparent flexible silver nanowire-based film comprising:
conductive nanowires formed by being sintered on at least a part of a flexible substrate; and
a polymer layer coated to surround surfaces of the conductive nanowires,
wherein the polymer layer includes graphene flakes.

12. The transparent flexible silver nanowire-based film of claim 11, further comprising a silane-treated hydrophobic coating layer coated to surround a surface of the polyurethane.

13. The transparent flexible silver nanowire-based film of claim 11, wherein the silane-treated hydrophobic solution includes at least one selected from a group consisting of methyltriethoxysilane (MTES), phenyl triethoxysilane (PhTES), octal triethoxysilane (OTES), tetraethylorthosilicate (TEOS), hexadecyltrimethoxysilane (HDTMS), and glycidoxy-pyltrimethoxysilane (GPTMS).

14. The transparent flexible silver nanowire-based film of claim 11, wherein the flexible substrate includes at least one selected from a group consisting of PET (polyethyleneterephthalate), PC (polycarbonate), PMMA (polymethyl methacrylate), TAC (triacetylcellulose), PEN (polyethylene naphthalate), and PES (polyethersulfone).

15. The transparent flexible silver nanowire-based film of claim 11, wherein the conductive nanowires include at least one selected from a group consisting of metal, conductive ceramics, conductive polymers, and composites thereof.

16. The transparent flexible silver nanowire-based film of claim 11, wherein the polymer layer includes polyurethane.

* * * * *